United States Patent
Ukai et al.

(10) Patent No.: US 7,787,509 B2
(45) Date of Patent: Aug. 31, 2010

(54) SEMICONDUCTOR LASER DEVICE

(75) Inventors: Tsutomu Ukai, Hyogo (JP); Masaya Mannoh, Hyogo (JP)

(73) Assignee: Panasonic Corporation, Osaka (JP)

( * ) Notice: Subject to any disclaimer, the term of this patent is extended or adjusted under 35 U.S.C. 154(b) by 311 days.

(21) Appl. No.: 11/711,629

(22) Filed: Feb. 28, 2007

(65) Prior Publication Data

US 2007/0201524 A1    Aug. 30, 2007

(30) Foreign Application Priority Data

Feb. 28, 2006    (JP) .............................. 2006-052249

(51) Int. Cl.
    *H01S 5/00*    (2006.01)
(52) U.S. Cl. .............................. 372/45.011; 372/46.016
(58) Field of Classification Search ............ 372/45.011, 372/46.01, 46.016, 44.011
    See application file for complete search history.

(56) References Cited

U.S. PATENT DOCUMENTS

| | | | | |
|---|---|---|---|---|
| 4,845,725 A | * | 7/1989 | Welch et al. ........... | 372/46.016 |
| 5,132,981 A | * | 7/1992 | Uomi et al. ............ | 372/45.012 |
| 5,166,945 A | * | 11/1992 | Arimoto ................. | 372/46.016 |
| 5,559,818 A | * | 9/1996 | Shono et al. ............. | 372/45.01 |
| 6,643,315 B2 | * | 11/2003 | Kasukawa et al. ............ | 372/96 |
| 2005/0195875 A1 | * | 9/2005 | Asano ......................... | 372/39 |

FOREIGN PATENT DOCUMENTS

| | | |
|---|---|---|
| JP | 06-224516 | 8/1994 |
| JP | 2833396 B2 | 10/1998 |

* cited by examiner

*Primary Examiner*—Minsun Harvey
*Assistant Examiner*—Patrick Stafford
(74) *Attorney, Agent, or Firm*—McDermott Will & Emery LLP (57) ABSTRACT

In a constitution where a first clad layer is formed on a semiconductor substrate, an active layer having the strained multiple quantum well structure is formed on the first clad layer, and a second clad layer is formed on the active layer, the sum of products of strain amounts and film thickness in the active layer is set to a negative value.

9 Claims, 8 Drawing Sheets

$$\begin{cases} \varepsilon_{wi} = (a_{wi} - a)/a \\ \varepsilon_{bj} = (a_{bj} - a)/a \\ \xi_{wi} = \varepsilon_{wi} \times t_{wi} \\ \xi_{bj} = \varepsilon_{bj} \times t_{bj} \\ \xi_{act} = \sum_{i=1}^{n}(\varepsilon_{wi} \times t_{wi}) + \sum_{j=1}^{m}(\varepsilon_{bj} \times t_{bj}) \end{cases}$$

F I G. 5 sum of product of strain amount and film thickness $\xi_{act}$

SEMICONDUCTOR LASER DEVICE

BACKGROUND OF THE INVENTION

1. Field of the Invention

The present invention relates to a semiconductor laser device comprising an active layer having the strained multiple quantum well structure where well layers and barrier layers having reverse strains respectively are laminated between clad layers.

2. Description of the Related Art

Demand for a semiconductor laser device is increased in a number of the technical fields. In particular, competition to achieve a higher speed in recording and reading operations is getting vehement in the semiconductor laser device for an optical disc. Compound semiconductors of AlGaAs (aluminum gallium arsenide) series are used in an infrared laser element applied to CD, CD-R, or the like, and the infrared laser element has an oscillation wavelength in the band of 780 nm.

At present, in the infrared laser element, the competition for a higher output has been almost completed, and in return, study has been done now actively to achieve a high output of a red laser element applied to DVD (Digital Versatile Disc). In the red laser element, compound semiconductors of AlGaInP (aluminum gallium indium phosphorous) series are used, and the red laser element consisting of these compounds has an oscillation wavelength in the band of 650 nm. Further, a two-wavelength semiconductor laser device in which the infrared laser element and the red laser element are integrated is now being developed.

In recent years, a stable operation is requested at the high-output in red semiconductor laser devices of 300 mW or more, and therefore it is necessary to achieve further improvements in an active layer and an end facet window structure. Examples of the technologies for increasing the output in the red semiconductor laser device of AlGaInP series include the followings.

1) A luminous efficiency is increased through constituting the active layer so as to have the multiple quantum well structure. The multiple quantum well structure means that well layers and barrier layers are laminated.
2) In order to control the catastrophic optical damage (COD) at the end facet due to the high-output operation or surge voltage, the end facet window region for increasing a band gap in the active layer is formed.
3) A carrier density in a p-type dopant layer is increased.

In the red semiconductor laser device of AlGaInP series, it is known that the luminous efficiency is increased when a compression strain is applied to a quantum well layer in the active layer, and a laser characteristic such as reduction of a threshold current and an operation current can be thereby improved. The compression strain can be generated, for example, by providing layers having a small lattice constant on both sides of the quantum well layer. However, when the applied strain is too large, a crystal defect is generated, which causes an adverse influence on the laser characteristic.

As recited in No. 2833396 of the Japanese Patent Publications, it is known that a tensile strain is applied to a barrier layer (blocking layer, light guide layer) for blocking a light in the well layer so that the sum of products of strain amounts and film thicknesses in an active layer is at least 0. The sum of the products of the strain amounts and the film thicknesses refers to the sum of the products of the strain amounts and the film thickness determined by the respective strain amounts, film thickness and numbers of layers in the well layers and barrier layers.

A further description is given below. Assuming that the well layers and the barrier layers are multilayered in the active layer. The sum of the products of the strain amounts and the film thicknesses in the active layer is defined as $\xi_{act}$ provided that the strain amount in the well layer of an ith (i=1, ..., n) order is $\epsilon_{wi}$ and the film thickness thereof is $t_{wi}$, and the strain amount in the barrier layer of a jth (j=1, ..., m) order is $\epsilon_{bj}$ and the film thickness thereof is $t_{bj}$. Then, the sum of the products of the strain amounts and the film thickness $\xi_{act}$ is the total of the sum of the products of the strain amounts and the film thickness in the well layers and the sum of the products of the strain amounts and the film thickness in the barrier layers. The compression strain is handled as plus, while the tensile strain is handled as minus.

The sum of the products of the strain amounts and the film thickness $\xi_{act}$, is defined as $\xi_{act} = \Sigma(\epsilon_{wi} \times t_{wi}) + \Sigma(\epsilon_{bj} \times t_{bj})$. The total sum here becomes the total of the sum of the products of the strain amounts and the film thickness in the well layers and the sum of the products of the strain amounts and the film thickness in the barrier layers over all of the layers (1-n, 1-m).

Figure 8:
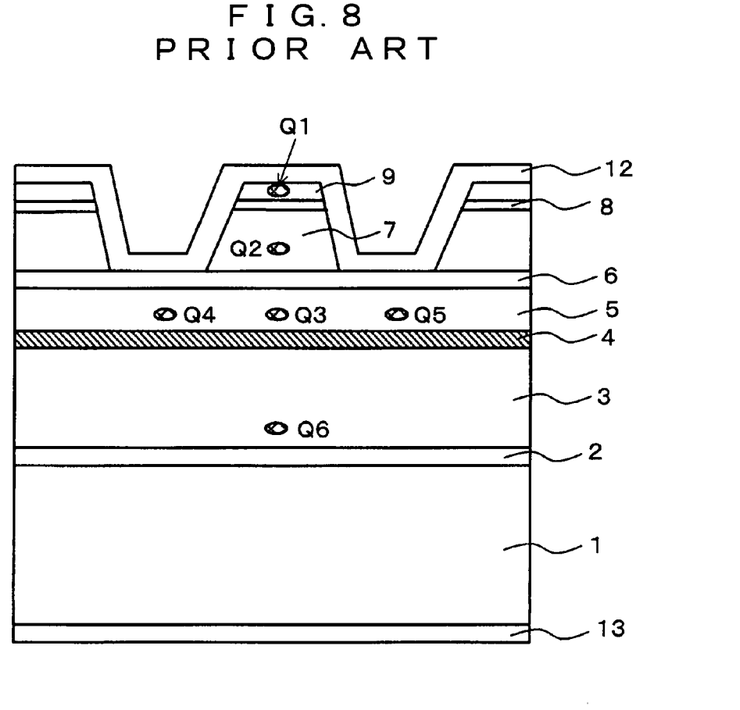
FIG. 8 shows a sectional structure of a light emitting end facet in a semiconductor laser device according to a conventional technology.
Figure 9:
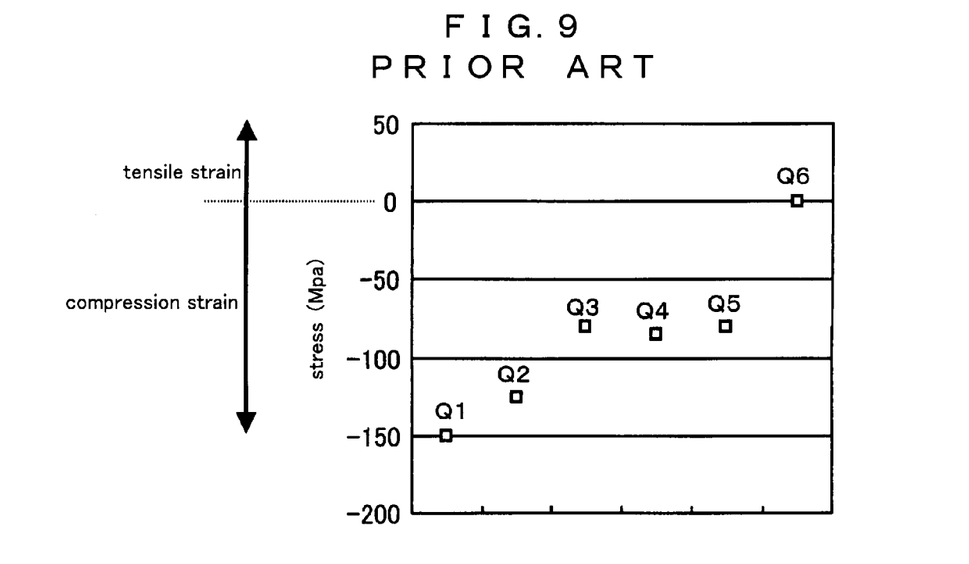
FIG. 9 is a stress evaluation chart by means of the Raman spectroscopy according to the conventional technology.

However, a conventional semiconductor laser device has the following disadvantage, which is described referring to FIGS. 8 and 9. FIG. 8 is a sectional view of a light emitting end facet of the conventional semiconductor laser device.

In vicinity of a ridge region, a stress evaluation was conducted by means of the Raman spectroscopy at a point Q1 in a contact layer 9, a point Q2 in a second p-type clad layer 7, points Q3, Q4 and Q5 in a first p-type clad layer 5, and a point Q6 in n-type clad layer 3, and a result of the evaluation is shown in FIG. 10. It is found out from the result that a very large tensile strain is applied to the points Q1-Q5 in the vicinity of the ridge region.

In the conventional technology, the sum of the products of the strain amounts and the film thickness $\xi_{act}$ in an active layer 4 is set to at least 0. Therefore, a difference between the strain amounts in the active layer 4 and the p-type clad layer 5 is increased, and thereby the stress inherent in the element becomes larger. As a result, the catastrophic optical damage (COD) and internal deterioration are generated at the end facet of the laser element in the high-output operation, which causes an adverse influence on reliability.

This is a huge problem in the red laser element of AlGaInP series having such a high output as at least 300 mW, and it is an urgent need to reduce the stress inherent in the element.

SUMMARY OF THE INVENTION

Therefore, a main object of the present invention is to provide a semiconductor laser device capable of obtaining a laser characteristic with high output and high reliability.

A semiconductor laser device according to the present invention, in order to solve the foregoing problem, comprises:
  a first clad layer formed on a semiconductor substrate;
  an active layer formed on the first clad layer and having a strained multiple quantum well structure; and
  a second clad layer formed on the active layer, wherein
  a sum of products of strain amounts and film thickness in the active layer is set to a negative value.

It is preferable that well layers and barrier layers having reverse strains each other are alternately laminated in the active layer, and the sum of the products of the strain amounts and the film thickness is a sum of products of strain amounts and film thickness determined by strain amounts, film thickness and number of layers that are corresponding to lattice constants of the well and barrier layers.

More specifically, a strain amount $\epsilon_{wi}$ of the well layer of an ith (i=1, ..., n) order is defined as $\epsilon_{wi} = (a_{wi} - a)/a$, and a strain amount $\epsilon_{bj}$ of the barrier layer of a jth (j=1, ..., m) order is defined as $\epsilon_{bj}=(a_{bj}-a)/a$, provided that a lattice constant of the semiconductor substrate is a, the lattice constant of the ith well layer is $a_{wi}$ and the film thickness thereof is $t_{wi}$, and the lattice constant of the jth barrier layer is $a_{bj}$ and the film thickness thereof is $t_{bj}$, and the sum of the products of the strain amounts and the film thickness $\xi_{act}$ in the active layer is represented as $\xi_{act}=\Sigma(\epsilon_{wi} \times t_{wi})+\Sigma(\epsilon_{bj} \times t_{bj})$, provided that a total number of the well layers is n and a total number of the barrier layers is m.

In the foregoing constitution, it is preferable that the first clad layer is an n-type clad layer, and the second clad layer is a p-type clad layer. The conductivity types of the respective clad layers may be reversed in its polarity.

In addition, there is an embodiment that the barrier layer may comprise a combination of a blocking layer interposed between the adjacent well layers, and a light guide layer interposed between the well layer and the clad layer.

As described earlier, in the conventional technology, the stress inherent in the element was increased by the difference between the strain amounts in the active layer and the clad layer because the sum of the products of the strain amounts and the film thickness in the active layer was set to 0 or a positive value. As a result, the catastrophic optical damage (COD) and internal deterioration were generated in the end facet of the laser element in the high-output operation, which adversely influenced the reliability.

On the contrary, as the sum of the products of the strain amounts and the film thickness in the active layer is set to a negative value in the present invention, the stress inherent in the vicinity of the active layer of the laser element can be reduced, and such a laser characteristic that can achieve a high output and a high reliability can be obtained.

Further, the sum of the products of the strain amounts and the film thickness in the active layer is set to a negative value, and the tensile strain is thereby applied to the active layer, so that an amount of Aluminum included in the blocking layer and the light guide layer is increased. Therefore, an amount of time for annealing in order to crystallize the active layer can be reduced in a process for forming an end facet window region.

In the foregoing constitution, it is preferable that the strain amount $\epsilon_{wi}$, the film thickness $t_{wi}$, the strain amount $\epsilon_{bj}$, the film thickness $t_{bj}$, and the sum of the products of the strain amounts and the film thickness $\xi_{act}$ are set respectively as follows:

$$0\% < \epsilon_{wi} \leq 1.0\%$$

$$-1.4\% \leq \epsilon_{bj} < 0\%$$

$$3 \text{ nm} < t_{wi} < 8 \text{ nm}$$

$$3 \text{ nm} < t_{bj} < 8 \text{ nm}$$

$$-1.97 \times 10^{-10} < \xi_{act} < 0$$

By doing this, the well layers are subject to the compression stress (the strain amount $\epsilon_{wi}$ turns to plus), while the barrier layers (blocking layer, light guide layer) are subject to the tensile stress (the strain amount $\epsilon_{wi}$ turns to minus). Under such circumstances, the film thickness do not exceed a critical film thickness, and the crystal defect is not generated. As a result, the semiconductor laser device can maintain its characteristic in a high quality.

Further, it is preferable that a plurality of semiconductor devices having different oscillation wavelengths each other is included, and these semiconductor laser devices be monolithically provided on the semiconductor substrate. This constitution is suitable for the combination of the red laser element and the infrared laser element.

There is a preferred embodiment that the semiconductor substrate consists of GaAs, the first clad layer consists of AlGaInP, the active layer consists of GaInP or AlGaInP, and the second clad layer consists of AlGaInP.

As well, it is also a preferred embodiment that the well layer consists of GaInP, and the barrier layer consists of AlGaInP.

It is also preferable that the blocking layer and the light guide layer consists of AlGaInP, and a composition ratio of In to AlGa included in the blocking layer is much larger than a ratio of In to AlGa included in the guide layer.

As described above, according to the present invention, the sum of the products of the strain amounts and the film thickness in the active layer is set to a negative value so that the stress inherent in the vicinity of the active layer of the laser element can be reduced. As a result, such a laser characteristic that can achieve a high output and a high reliability can be obtained.

Further, the window structure can be formed in a short time, and the diffusion of impurities into the active layer is less likely to occur. Therefore, the output can be further increased. This constitution is particularly effective in the red semiconductor laser device comprising the active layer having the strain compensated multiple quantum well structure.

The semiconductor laser device according to the present invention is useful for a recording optical disc device or the like wherein such a laser characteristic that achieves a high output and a high reliability is demanded.

BRIEF DESCRIPTION OF THE DRAWINGS

These and other objects as well as advantages of the invention will become clear by the following description of preferred embodiments of the invention. A number of benefits not recited in this specification will come to the attention of those skilled in the art upon the implementation of the present invention.

DETAILED DESCRIPTION OF THE INVENTION

Hereinafter, preferred embodiments of the present invention are described referring to the drawings.

Preferred Embodiment 1

Figure 1:
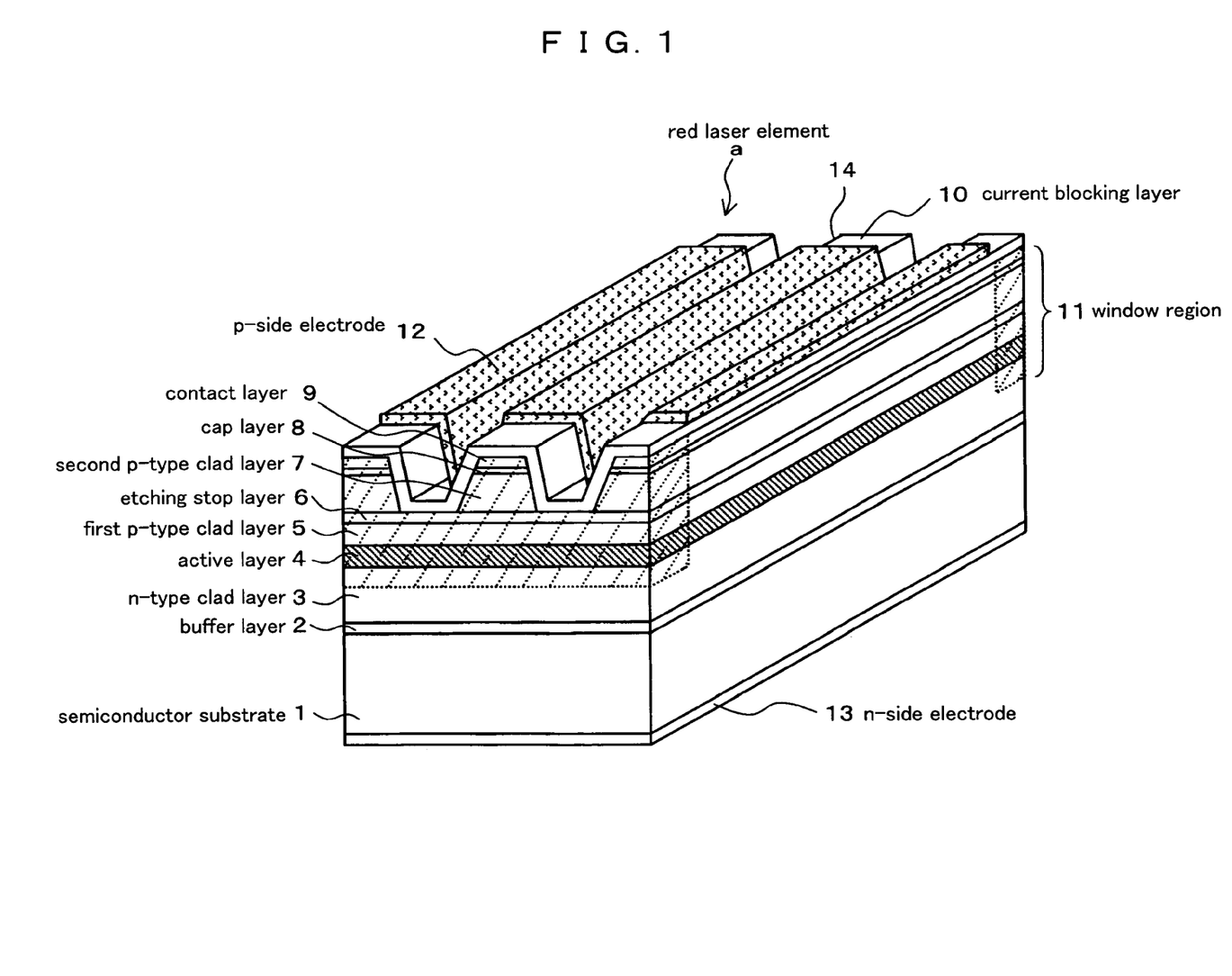
FIG. 1 is an enlarged perspective view illustrating a semiconductor laser device according to a preferred embodiment 1 of the present invention.

A preferred embodiment 1 of the present invention relates to a structure of a red semiconductor laser device. FIG. 1 is an enlarged perspective view illustrating a structure of the red laser element having the double hetero-junction structure according to the preferred embodiment 1. Referring to reference numerals shown in FIG. 1, 1 denotes an n-GaAs semiconductor substrate, 2 denotes an n-GaAs buffer layer formed on the semiconductor substrate 1, 3 denotes an n-type clad layer formed on the buffer layer 2, 4 denotes an active layer formed on the n-type clad layer 3 that emits a laser light, 5 denotes a first p-type clad layer formed on the active layer 4, 6 denotes an etching stop layer formed on the first p-type clad layer 5, 7 denotes a second p-type clad layer formed on the etching stop layer 6, 8 denotes a cap layer formed on the second p-type clad layer 7, 9 denotes a contact layer formed on the cap layer 8, 10 denotes a current blocking layer formed on the contact layer 9, 11 denotes an end facet window region formed below the current blocking layer 10 at an emitting end facet of the red laser element, 12 denotes a p-side electrode formed on the current blocking layer 10, and 13 denotes an n-side electrode formed below the semiconductor substrate 1.

The buffer layer 2 is necessary in order to improve the crystallinity of the n-type clad layer 3, first p-type clad layer 5, second p-type clad layer 7, active layer 4 and the like. There are formed ridges 14 in the contact layer 9, cap layer 8 and second p-type clad layer 7, and the p-side electrode 12 is formed on the ridges 14.

The compositions of In, Ga and Al are determined as below. The compositions of In, Ga and Al are determined so that lattice constants of the double hetero-junction structure consisting of the n-type clad layer 3, active layer 4, first p-type clad layer 5, etching stop layer 6, second p-type clad layer 7 and cap layer 8 are equal to that of the n-GaAs substrate 1, and band gap energies of the n-type clad layer 3, first p-type clad layer 5, etching stop layer 6, second p-type clad layer 7 and cap layer 8 are larger than that of the active layer 4.

More specifically,

Si is doped in the n-GaAs substrate 1 by the dopant density of $1.0 \times 10^{18}$ cm$^{-3}$.

Si is doped in the n-GaAs buffer layer 2 by the dopant density of $1.0 \times 10^{18}$ cm$^{-3}$, and a film thickness thereof is 0.5 μm.

The n-type clad layer 3 comprises a substance having the composition formula of n-$(Al_{0.7}Ga_{0.3})_{0.5}In_{0.5}P$, wherein Si is doped by the dopant density of $5.5 \times 10^{17}$ cm$^{-3}$, and a film thickness thereof is 2.0 μm.

The active layer 4 consists of the composition formula of $Ga_{0.5}In_{0.5}P$ or $(Al_{0.5}GA_{0.5})0.5In_{0.5}$.

The first p-type clad layer 5 consists of the composition formula of p-$(Al_{0.7}Ga_{0.3})_{0.5}In_{0.5}P$, wherein Zn is doped by the dopant density of $1.0 \times 10^{18}$ cm$^{31\ 3}$, and a film thickness thereof is 150 nm.

The etching stop layer 6 is compounded of the composition formula of p-$Ga_{0.5}In_{0.5}P$, wherein Zn is doped by the dopant density of $1.2 \times 10^{18}$ cm$^{-3}$, and a film thickness thereof is 8 nm.

The second p-type clad layer 7 is compounded of the composition formula of p-$(Al_{0.7}Ga_{0.3})_{0.5}In_{0.5}P$, wherein Zn is doped by the dopant density of $1.2 \times 10^{18}$ cm$^{-3}$, and a film thickness thereof is 1.2 μm.

The cap layer 8 is made up of the composition formula of p-$Ga_{0.5}In_{0.5}P$, wherein Zn is doped by the dopant density of $1.2 \times 10^{18}$ cm$^{-3}$, and a film thickness thereof is 50 nm.

The contact layer 9 is made up of the composition formula of p-GaAs, wherein Zn is doped by the dopant density of $6.0 \times 10^{19}$ cm$^{-3}$, and a film thickness thereof is 300 nm.

Figure 2A:
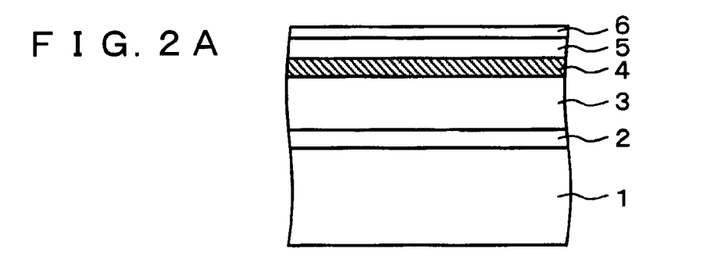
FIG. 2 is a sectional view illustrating a manufacturing process of the semiconductor laser device according to the preferred embodiment 1.

Next, a method of manufacturing the semiconductor laser device according to the preferred embodiment 1 is described. As shown in FIG. 2A, the n-GaAs buffer layer 2 is formed on the n-GaAs semiconductor substrate 1, the n-type clad layer 3 is formed on the buffer layer 2, the active layer 4 that emits the laser light is formed on the n-type clad layer 3, the first p-type clad layer 5 is formed on the active layer 4, and the etching stop layer 6 is formed on the first p-type clad layer 5 by means of the MOCVD method or the like.

Figure 2B:
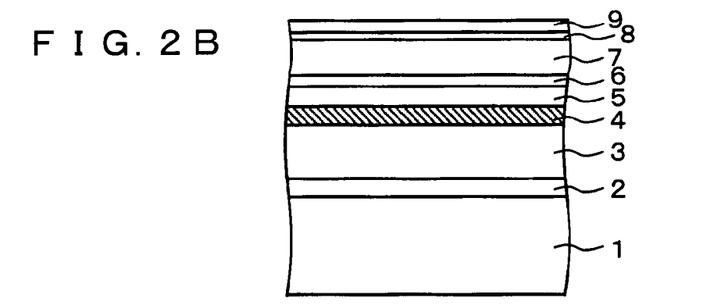

Next, as shown in FIG. 2B, the second p-type clad layer 7 is formed on the etching stop layer 6, the cap layer 8 is formed on the second p-type clad layer 7, and the contact layer 9 is formed on the cap layer 8. Furthermore, the formation of the respective layers, which is shown in FIGS. 2A and 2B, is generally completed in single deposition process.

Figure 2C:
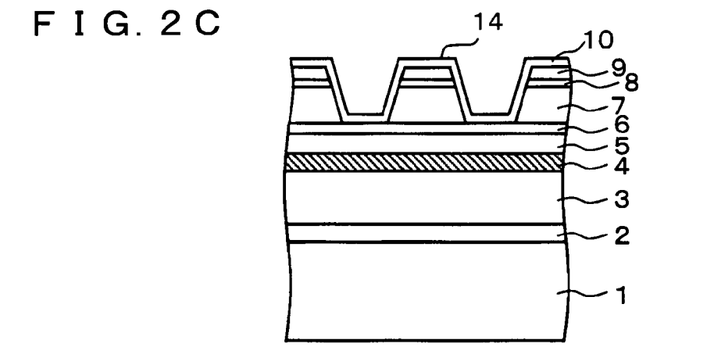

After the respective layers are formed, a ZnO stripe film is selectively formed on the surface of the grown layers corresponding to the light emitting end facet and its vicinity, while a SiN film is formed on any other part on the surface. Here, the ZnO stripe film is formed in a band shape so as to cover the light emitting end facet along a longitudinal direction thereof. Then, a thermal annealing process is performed at 600° C. in the N$_2$ atmosphere for 90 minutes to diffuse Zn into the crystals from ZnO which is a diffusion source so that the band gap of the active layer 4 is increased. Thereby, the end facet window region 11 in which the band gap is increased is formed on the active layer 4. The end facet window region 11 is formed in the band shape so as to cover the light emitting end facet along the longitudinal direction thereof in a manner similar to the formation region of the ZnO stripe film. As a result of the formation of the end facet window region 11, the catastrophic optical damage (COD) in the end facet due to the high-output operation and surge voltage can be controlled Next, as shown in FIG. 2C, the ZnO film and the SiN film are removed, and the contact layer 9, cap layer 8, and second p-type clad layer 7 are partially removed by means of the etching process. These films to be etched are removed in a band shape along the surface of the grown layers and a direction orthogonally intersecting with the longitudinal direction of the end facet window region 11. As a result, the ridge 14 having a stripe shape is formed. The plurality of ridges 14 is formed in parallel with each other.

The current blocking layer 10 is formed on the surface of the ridges 14 by performing an embedding process selectively. The current blocking layer 10 consists of n-$Al_{0.5}In_{0.5}P$ wherein Si is doped by the dopant density of $7.5 \times 10^{17}$ cm$^{-3}$.

Figure 2D:
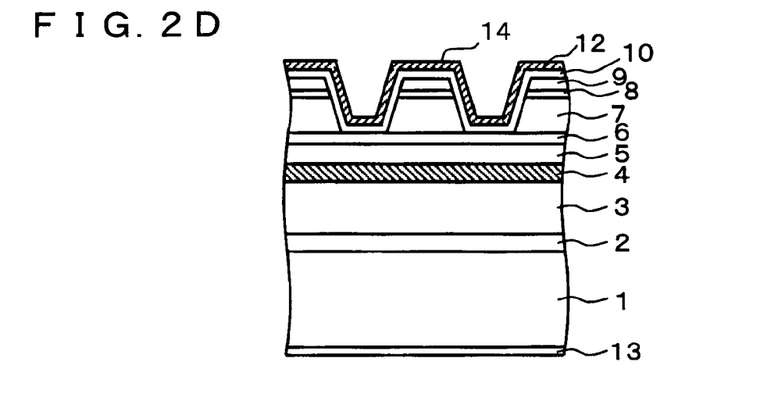

Finally, as shown in FIG. 2D, the p-side electrode 12 is formed on the surface of the contact layer 9 provided with the current blocking layer 10, and the n-side electrode 13 is formed on the rear surface of the n-GaAs semiconductor substrate 1 (surface on which the n-GaAs buffer layer 2 is not formed).

The compositions in the respective layers described above is merely an example, and the ratios of In, Ga and Al included in the respective layers may be determined so that the following conditions can be satisfied:

The lattice constants of the respective layers 3-7 and the cap layer 8 according to the double hetero-junction structure are substantially equal to that of the n-GaAs semiconductor substrate 1; and The band gap energies of the n-type clad layer 3, first p-type clad layer 5, etching stop layer 6, second p-type clad layer 7 and cap layer 8 are larger than that of the active layer 4.

All of the layers are formed through the crystal growth by means of the MOCVD method (Metal Organic Chemical Vapor Deposition), and impurities in the respective layers are added at the same time when the respective layers are crystal-grown.

Figure 3:
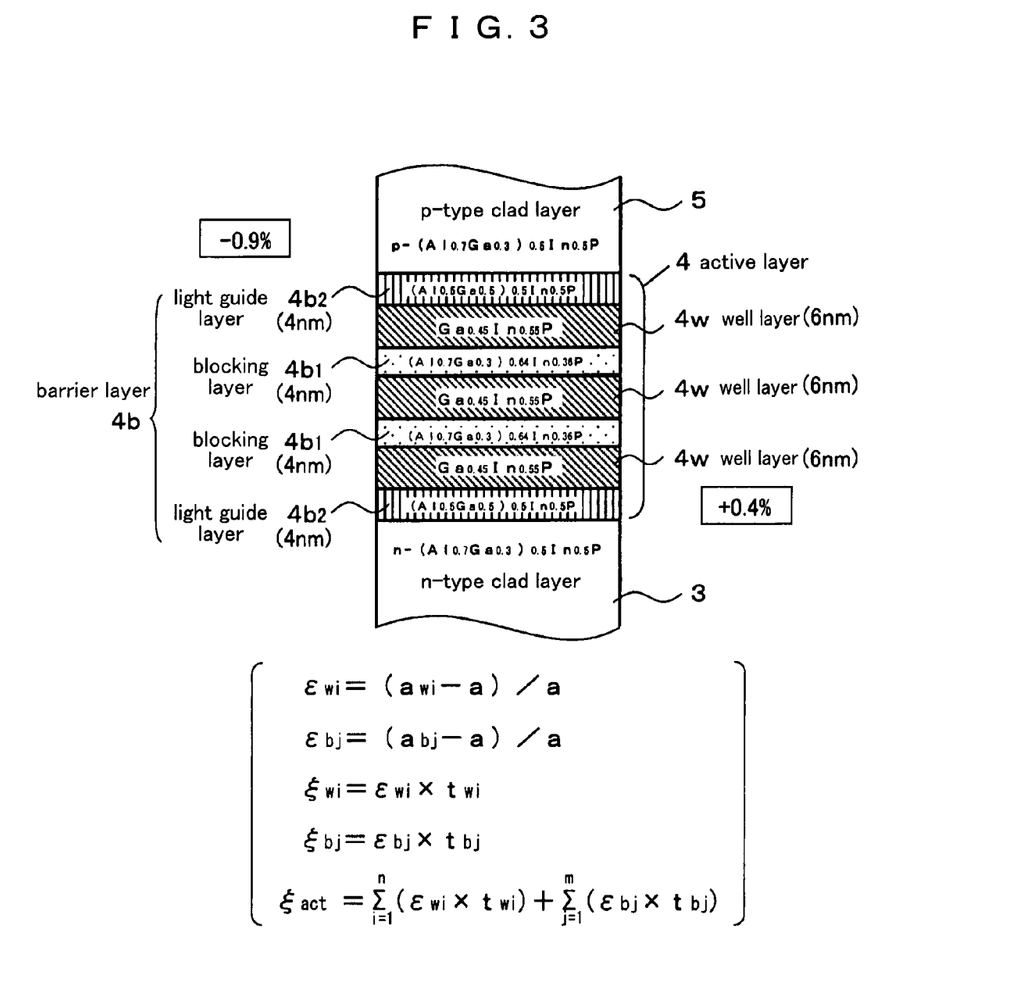
FIG. 3 is an enlarged sectional view of clad layers and an active layer that are main part of the semiconductor laser device according to the preferred embodiment 1.

FIG. 3 is an enlarged sectional view of the clad layers and the active layer that are the main bodies of the semiconductor laser device according to the preferred embodiment 1. Referring to reference symbols shown in FIG. 3, 3 denotes an n-type clad layer, 4 denotes an active layer having the strain compensated multiple quantum well structure, 5 denotes a p-type clad layer, $4w$ denotes a well layer, $4b_1$ denotes a blocking layer, and $4b_2$ denotes a light guide layer.

The active layer 4 comprises the light guide layer $4b_2$, well layer $4w$, blocking layer $4b_1$, well layer $4w$, blocking layer $4b_1$, well layer $4w$ and light guide layer $4b_2$, that are laminated sequentially from the bottom, and has the strain compensated multiple quantum well structure comprising these layers laminated on one another. The blocking layer $4b_1$ and the light guide layer $4b_2$ consist of aluminum gallium indium phosphorous (AlGaInP), and the well layer 4 consist of GaInP (gallium indium phosphorous).

More detailed composition is as follows.

The light guide layer $4b_2$ comprises a substance having the composition formula of $(Al_{0.5}Ga_{0.5})_{0.5}In_{0.5}Pk$, wherein no impurity is doped, and a film thickness thereof is 4.0 μm.

The blocking layer $4b_1$ comprises a substance having the composition formula of $(Al_{0.7}Ga_{0.3})_{0.64}In_{0.36}P$, wherein no impurity is doped, and a film thickness thereof is 4.0 μm.

The well layer $4w$ comprises a substance having the composition formula of $Ga_{0.45}In_{0.54}P$, wherein no impurity is doped, and a film thickness thereof is 6.0 μm.

The blocking layer $4b_1$ and the light guide layer $4b_2$ respectively have a tensile strain (−0.9%), and the well layer $4w$ has a compression strain (+0.4%) as a result of the lattice alignment with the GaAs substrate 1.

The blocking layer $4b_1$ and the light guide layer $4b_2$ are collectively called a barrier layer, and the barrier layer is shown by a symbol $4b$. The combination of the blocking layer $4b_1$ and the light guide layer $4b_2$ constitutes the barrier layer $4b$.

The sum of products of strain amounts and film thickness $\xi_{act}$ in the active layer 4 is examined below. It is assumed that the lattice constant of the substrate is a, the lattice constant of the well layer $4w$ of an ith (i=1, 2, ..., n) order is $a_{wi}$ and a film thickness thereof is $t_{wi}$, and the lattice constant of the barrier layer $4b$ of a jth (j=1, 2, ..., m) order is $a_{bj}$ and a film thickness thereof is $t_{bj}$.

The strain amount of the ith well layer $4w$, $\epsilon_{wi}$, is defined as $\epsilon_{wi}=(a_{wi}-a)/a$, and the strain amount of the jth barrier layer $4b$, $\epsilon_{bj}$, is defined as $\epsilon_{bj}=(a_{bj}-a)/a$.

The product of the strain amount and the film thickness in each of the layers are called the strain amount film thickness product. It is shown by as $\xi$. The product of the strain amount and the film thickness in the ith well layer $4_w$, $\xi_{wi}$, is defined as $\xi_{wi}=\epsilon_{wi}\times t_{wi}$. The sum of the products of the strain amounts and the film thickness in the well layers $4w$, $\Sigma\xi_{wi}$, provided that a total number of the well layers $4w$ is n, is defined as $\Sigma\xi_{wi}=\Sigma\epsilon_{wi}\times t_{wi}$ (i=1, 2, ..., n). The product of the strain amount and the film thickness in the jth barrier layer $4b$, $\xi_{bj}$, is defined as $\xi_{bj}=\epsilon_{bj}\times t_{bj}$. The sum of the products of the strain amounts and the film thickness in the barrier layer $4b$, $\Sigma\xi_{bj}$, provided that a total number of the layers in the barrier layer $4b$ is m, is defined as $\Sigma\xi_{bj}=\Sigma\epsilon_{bj}\times t_{bj}$ (j=1, 2, ..., m). The total number of the layers in the barrier layer $4b$ is equal to the total of the number of the blocking layers $4b_1$ and the number of the light guide layers $4b_2$. Therefore, the sum of the products of the strain amounts and the film thickness in the entire active layer 4 comprising the well layers $4w$ and the barrier layer $4b$, $\xi_{act}$, is defined as $\xi_{act}=\Sigma\xi_{wi}+\Sigma\xi_{bj}=\Sigma(\epsilon_{wi}\times t_{wi})+\Sigma(\epsilon_{bj}\times t_{bj})$. The sum covers all of the layers (1-n, 1-m). The present invention is characterized in a point that the sum of the products of the strain amounts and the film thickness, $\xi_{act}$, is set to a negative value.

Figure 4A:
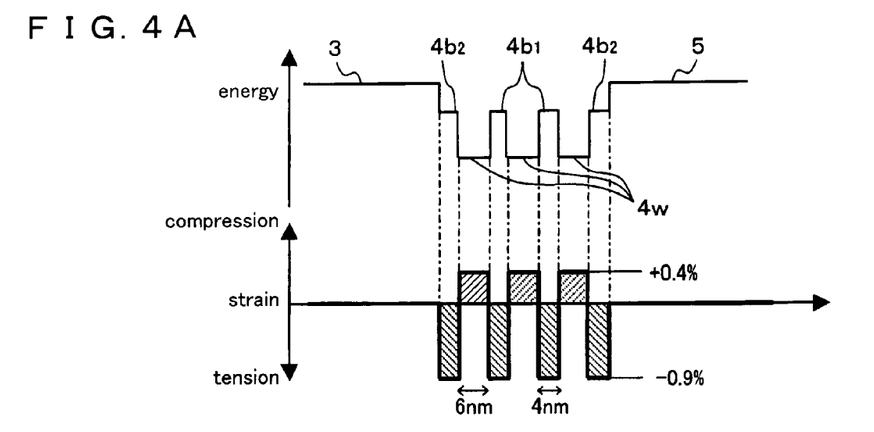
FIG. 4 is a diagram showing a relationship between a strain amount and a band gap in the preferred embodiment 1.

FIG. 4A shows a relationship between the strain amount and the band gap. In the present preferred embodiment, a composition ratio y of aluminum gallium $(Al_xGa_{1-x})$ and indium (In) included in the composition of $(Al_xGa_{1-x})_yIn_{1-y}P$ is adjusted so that the compression strain is applied to the well layers $4w$ and thereby the tensile strain is applied to the blocking layer $4b_1$ and the light guide layer $4b_2$. More specifically, in a state where the ratio y is 0.5, the well layers $4w$ are not subject to any strain because of the lattice alignment. When the relative proportion y is smaller than 0.5, the compression strain is applied to the well layers $4w$. When the relative proportion y is larger than 0.5, the tensile strain is applied to the well layers $4w$.

Based on a point of aforementioned observation, the composition ratio y in the light guide layer $4b_2$ is y=0.5, and the composition ratio y in the blocking layer $4b_1$ is y=0.64>0.5 in the present preferred embodiment. As a result, the tensile strain is applied to the active layer 4.

By comprising the constitution described above, in the present preferred embodiment, n=3, m=4, $\epsilon_{wi}$=+0.4%, $\epsilon_{bj}$=−0.9%, $t_{wi}$=6 nm, and $t_{bj}$=4 nm, and the sum of the products of the strain amounts and the film thickness, $\xi_{act}$, is obtained by $\xi_{act}$=−0.72×10$^{10}$ m. More specifically, a total area on the negative side is larger than a total area on the positive side in the graph showing the strain amounts in the sum of the products of the strain amounts and the film thickness (see the hatched area in FIG. 4A). Therefore, the sum of the products of the strain amounts and the film thicknesses, $\xi_{act}$, becomes a negative value.

In the conventional technology, the sum of the products of the strain amounts and the film thicknesses, $\xi_{act}$, is 0 or a positive value, and the compression strain is accordingly applied to the active layer 4. On the contrary, the sum of the products of the strain amounts and the film thickness, $\xi_{act}$, is a negative value in the present preferred embodiment, and the tensile strain is accordingly applied to the active layer 4.

Figure 4B:
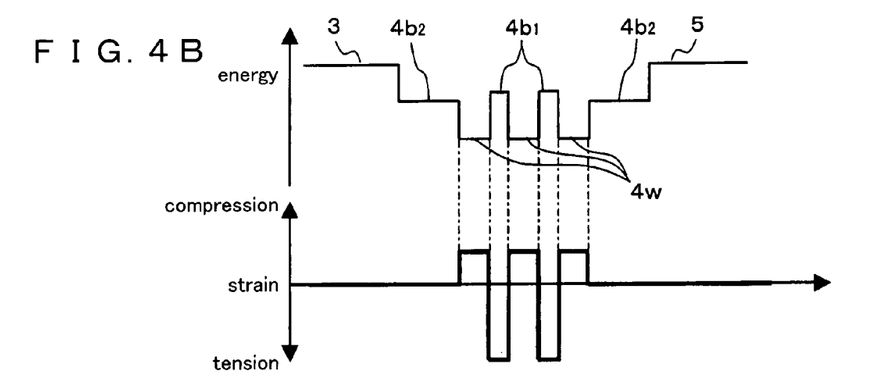
Figure 4C:
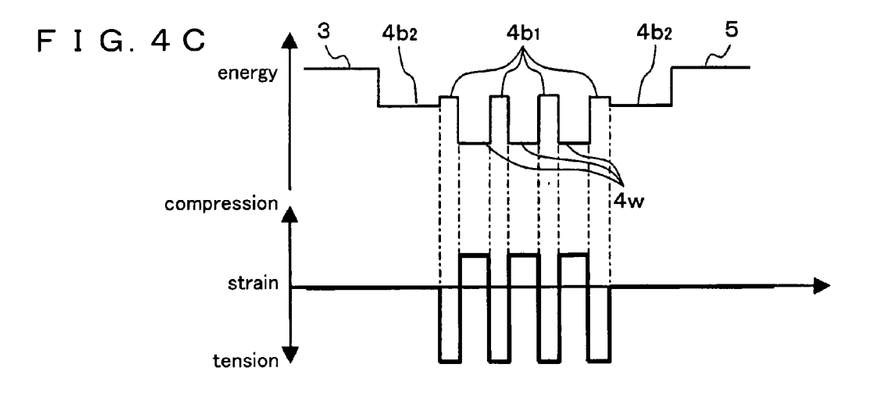

The active layer 4 may be constituted as shown in FIGS. 4 and 4C as variations. In the constitution shown in FIG. 4B, the composition ratio y is 0.5 in the light guide layer $4b_2$, which means that no strain is applied. The film thickness of the light guide layer $4b_2$ is relatively increased. In the constitution shown in FIG. 4C, the number of the blocking layers $4b_1$ becomes four in addition to the constitution shown in FIG. 4A.

Figure 5:
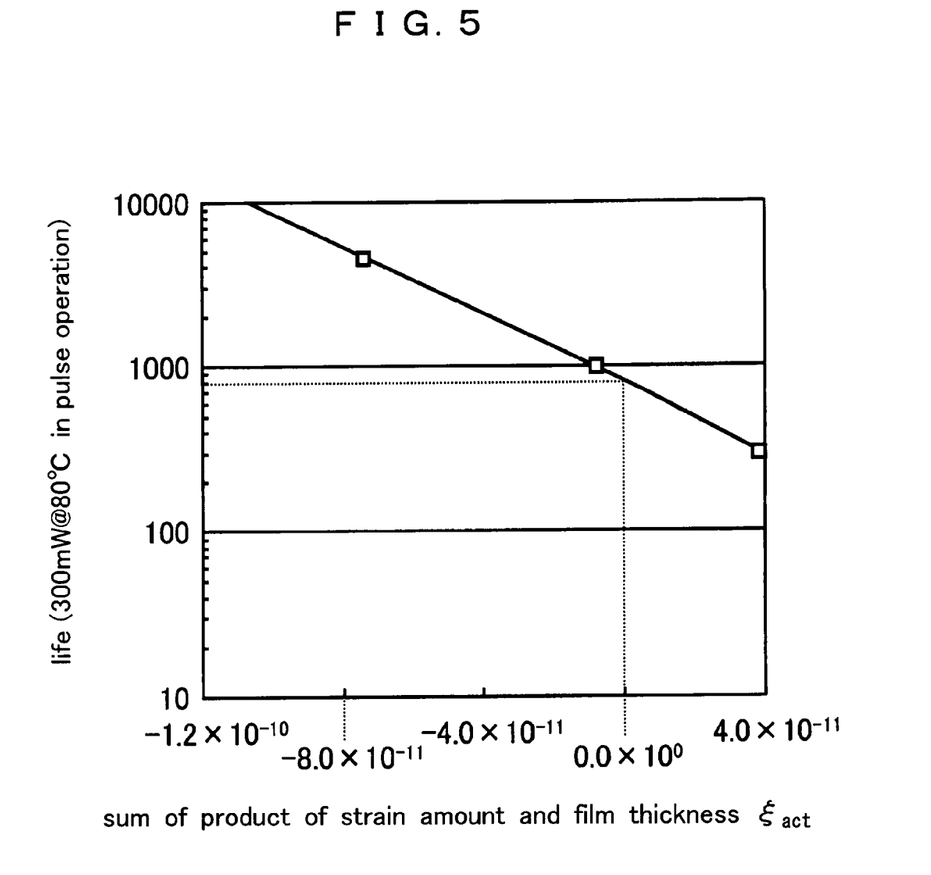
FIG. 5 is a diagram showing a life characteristic in relation to the sum of products of strain amounts and film thicknesses in the semiconductor laser device according to the preferred embodiment 1.

FIG. 5 shows a life characteristic in a pulse operation with the light output of 300 mW at 80° C. in the semiconductor laser device. In FIG. 5, the sum of the products of the strain amounts and the film thicknesses, $\xi_{act}$, in the active layer 4 is shown in a horizontal axis, while the life is shown in a vertical axis. The conditions are as follows. In the well layers $4w$, the added strain is $\epsilon\xi_{wi}$=+0.4%, the film thickness thereof is $t_{wi}$=6 nm, and the number of the well layers n=3. Therefore, the sum of the products of the strain amounts and the film thickness, $\Sigma\xi_{wi}$, in the well layers $4w$ becomes 0.72×10$^{−10}$. In the barrier layer 4b (blocking layer $4b_1$ and light guide layer $4b_2$), the film thickness $t_{bj}$=4 nm, the number of the barrier layers m=4 is set respectively, and the amount of the added strain $\epsilon_{bj}$ is changed from −0.2%, to −0.36%, and then to −0.9%. Therefore, the sum of the products of the strain amounts and the film thickness, $\xi_{act}$, in the well layers 4w is $-0.72\times10^{-11}$, $-1.44\times10^{-11}$ and $+4\times10^{-11}$ respectively.

When the sum of the products of the strain amounts and the film thicknesses, $\xi_{act}$, in the active layer 4 is at least 0, the deterioration of the laser characteristic is observed in at most 800 hours. When the sum of the products of the strain amounts and the film thicknesses, $\xi_{act}$, is smaller than 0, the operation of the semiconductor laser device is stabilized beyond 800 hours. It is thought that the reason is that the stress applied to the active layer 4 is increased because the tensile strain is applied to the inside of the ridges 14.

It is pointed out from the foregoing measurement result that the red semiconductor laser device capable of achieving a high reliability with a high output cannot be obtained in the constitution wherein the tensile strain is not applied to the active layer 4, however, such a semiconductor laser device can be obtained in the constitution wherein the tensile strain is applied to the active layer 4.

Additionally, as the amount of Al included in the blocking layer $4b_1$ and the light guide layer $4b_2$ is increased through applying a tensile strain to the active layer 4, an amount of annealing time for producing mixed crystals from the active layer 4 can be reduced.

In order to increase the output of the red semiconductor laser device of AlGaInP series, it is necessary to increase a carrier density in the p-type dopant layer. However, as a conventionally known problem, the p-type dopant of AlGaInP series diffuses on over to the active layer 4 due to the thermal history such as the annealing, which adversely influences the reliability. On the contrary, in the constitution according to the present preferred embodiment, the diffusion of the p-type dopant into the active layer 4 can be controlled by the application of the tensile strain to the active layer 4. Therefore, the present invention is superior in a point that the foregoing problem can also be solved, which is further advantageous in increasing the output.

Including the foregoing effect, it appears that the deterioration is not observed after 800 hours passed in the pulse operation with the light output of 300 mW and at 80° C. as shown in FIG. 5.

In the present preferred embodiment, the good laser characteristic can be obtained through setting the strain amount $\epsilon_{wi}$ and the film thickness $t_{wi}$ in the well layers 4w and the strain amount $\epsilon_{bj}$ and the film thickness $t_{bj}$ in the barrier layer 4b (blocking layer $4b_1$ and light guide layer $4b_2$) to the values described earlier.

By the way, if the film thickness is excessively large or the strain amount is excessively large in the active layer 4, the crystal defect may be generated through exceeding a critical film thickness. Therefore, it is necessary to appropriately determine the parameter of the active layer 4. In the present preferred embodiment, therefore, it is desirable that the strain amount $\epsilon_{wi}$ and the film thickness $t_{wi}$ in the well layerd 4w, the strain amount $\epsilon_{bj}$ and the film thickness $t_{bj}$ in the barrier layer 4b, and the sum of the products of the strain amounts and the film thicknesses, $\xi_{act}$, in the active layer 4 are set as follows:

$0\% < \epsilon_{wi} \leq 1.0\%$ $-1.4\% \leq \epsilon_{bj} < 0\%$ $3\ \text{nm} < t_{wi} < 8\ \text{nm}$ $3\ \text{nm} < t_{bj} < 8\ \text{nm}$ $-1.97\times10^{-10} < \xi_{act} < 0$ Under the foregoing conditions, the film thickness does not exceed the critical film thickness, and the crystal defect is not generated. Therefore, the characteristic of the semiconductor laser device can maintain a high quality.

Preferred Embodiment 2

Figure 6:
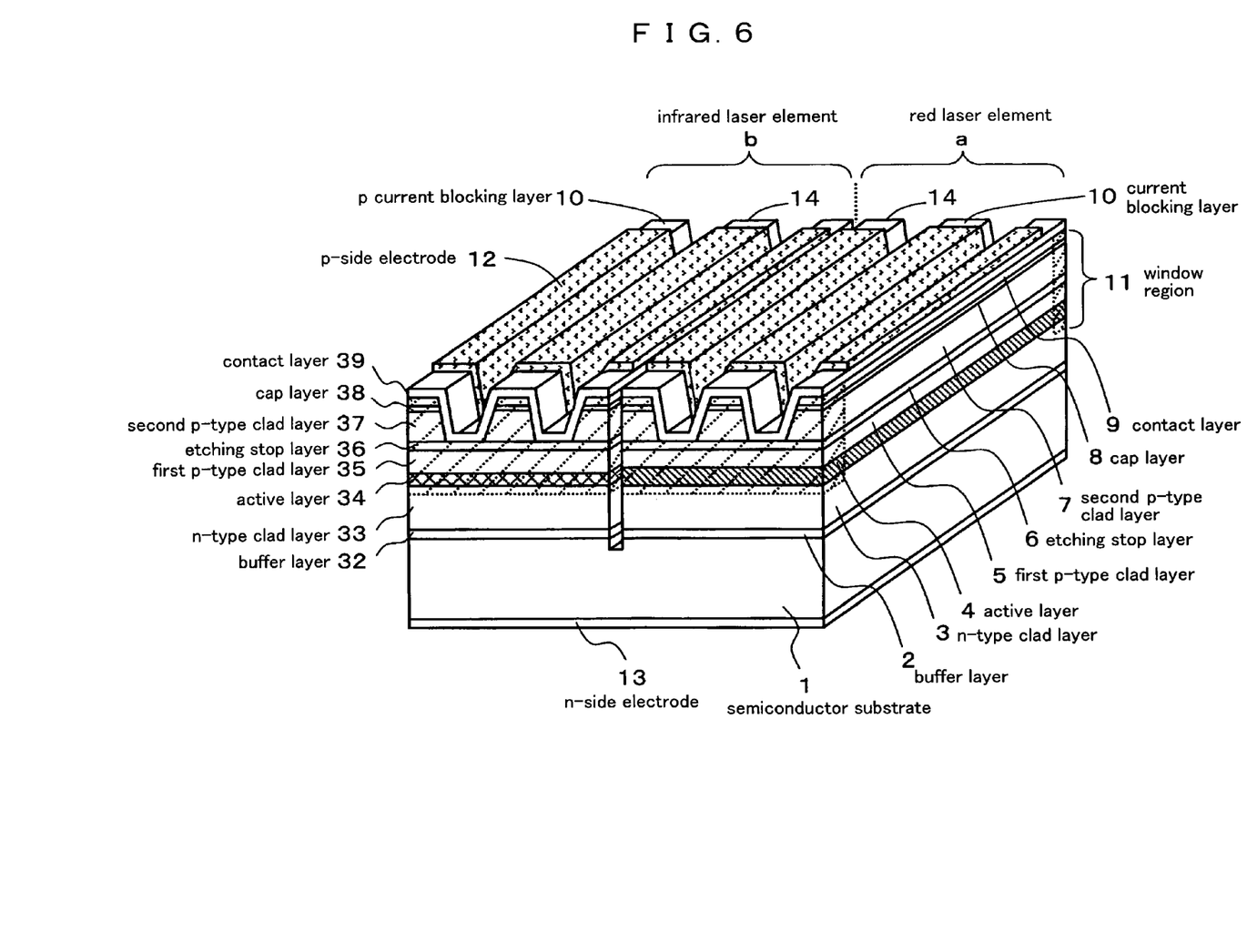
FIG. 6 is an enlarged perspective view illustrating a monolithic two-wavelength semiconductor laser device according to a preferred embodiment 2 of the present invention.

FIG. 6 is an enlarged perspective view illustrating a high-output two-wavelength semiconductor laser device of the monolithic type according to a preferred embodiment 2 of the present invention. A red laser element a and a red laser element b are provided on an n-GaAs substrate 1, and the respective elements a and b are constituted as follows.

An n-GaAs buffer layer 2 is formed on the n-GaAs substrate 1 in the red laser element a, and an n-type clad layer 3, an active layer 4, a first p-type clad layer 5, a p-type etching stop layer 6, a second p-type clad layer 7, a p-type cap layer 8, and a p-type contact layer 9 are formed on the buffer layer 2.

The properties and the compositions are more specifically described as follows.

Si is doped in the n-GaAs substrate 1 by the dopant density of $1.0\times10^{18}\ \text{cm}^{-3}$.

Si is doped in the n-GaAs buffer layer 2 by the dopant density of $5.0\times10^{17}\ \text{cm}^{-3}$, and a film thickness thereof is 0.5 μm.

The n-type clad layer 3 consists of a substance having the composition formula of n-$(Al_{0.7}Ga_{0.3})_{0.5}In_{0.5}P$, wherein Si is doped by the dopant density of $5.0\times10^{17}\ \text{cm}^{-3}$, and a film thickness thereof is 2.0 μm.

The active layer 4 comprises a substance of $Ga_{0.5}In_{0.5}P$ series or $(Al_{0.5}Ga_{0.5})_{0.5}In_{0.5}P$ series.

The first p-type clad layer 5 comprises a substance having the composition formula of p-$(Al_{0.7}Ga_{0.3})_{0.5}In_{0.5}P$, wherein Zn is doped by the dopant density of $9.0\times10^{17}\ \text{cm}^{-3}$, and a film thickness thereof is 200 nm.

The etching stop layer 6 comprises a substance having the composition formula of p-$Ga_{0.5}In_{0.5}P$, wherein Zn is doped by the dopant density of $1.5\times10^{18}\ \text{cm}^{-3}$, and a film thickness thereof is 6 nm.

The second p-type clad layer 7 comprises a substance having the composition formula of p-$(Al_{0.7}Ga_{0.3})_{0.5}In_{0.5}P$, wherein Zn is doped by the dopant density of $1.2\times10^{18}\ \text{cm}^{-3}$, and a film thickness thereof is 1.2 μm.

The cap layer 8 comprises a substance having the composition formula of p-$Ga_{0.5}In_{0.5}P$, wherein Zn is doped by the dopant density of $1.5\times10^{18}\ \text{cm}^{31\ 3}$, and a film thickness thereof is 50 nm.

The contact layer 9 comprises a substance having the composition formula of p-GaAs, wherein Zn is doped by the dopant density of $3.0\times10^{19}\ \text{cm}^{-3}$, and a film thickness thereof is 200 nm.

An n-GaAs buffer layer 32 is formed on the n-GaAs substrate 1 in the red laser element b, and an n-type clad layer 33, an active layer 34, a first p-type clad layer 35, a p-type etching stop layer 36, a second p-type clad layer 37, a p-type cap layer 38, and a p-type contact layer 39 are formed on the buffer layer 32 in the same manner as the red laser element a.

The properties and the compositions are more specifically described as follows.

Si is doped in the n-GaAs buffer layer 32 by the dopant density of $1.0\times10^{18}$ cm$^{-3}$, and a film thickness thereof is 0.5 μm.

The n-type clad layer 33 comprises a substance having the composition formula of n-$(Al_{0.7}Ga_{0.3})_{0.5}In_{0.5}P$, wherein Si is doped by the dopant density of $5.0\times10^{17}$ cm$^{-3}$, and a film thickness thereof is 2.5 μm.

The active layer 34 comprises a substance of GaAs series or AlGaAs series.

The first p-type clad layer 35 comprises a substance having the composition formula of p-$(Al_{0.7}Ga_{0.3})_{0.5}In_{0.5}P$, wherein Zn is doped by the dopant density of $4.0\times10^{17}$ cm$^{-3}$, and a film thickness thereof is 190 nm.

The etching stop layer 36 comprises a substance having the composition formula of p-$Ga_{0.5}In_{0.5}P$, wherein Zn is doped by the dopant density of $1.1\times10^{18}$ cm$_{-3}$, and a film thickness thereof is 6 nm.

The second p-type clad layer 37 comprises a substance having the composition formula of p-$(Al_{0.7}Ga_{0.3})_{0.5}In_{0.5}P$, wherein Zn is doped by the dopant density of $1.0\times10^{18}$ cm$^{-3}$, and a film thickness thereof is 1.2 μm.

The cap layer 38 comprises a substance having the composition formula of p-$Ga_{0.5}In_{0.5}P$, wherein Zn is doped by the dopant density of $1.1\times10^{18}$ cm$^{-3}$, and a film thickness thereof is 50 nm.

The contact layer 39 comprises a substance having the composition formula of p-GaAs, wherein Zn is doped by the dopant density of $3.0\times10^{19}$ cm$^{-3}$, and a film thickness thereof is 200 nm.

Difference between the red laser element a and the red laser element b, that were described above, is as follows.

The Si doping quantity in the buffer layer 2 is smaller than the Si doping quantity in the buffer layer 32.

The film thickness of the n-type clad layer 3 is smaller than the film thickness of the n-type clad layer 33.

The active layer 4 comprises the substance of $Ga_{0.5}In_{0.5}P$ series or $(Al_{0.5}Ga_{0.5})_{0.5}In_{0.5}P$ series, and the active layer 34 comprises the substance having the composition formula of GaAs series or AlGaAs series.

The Zn doping quantity in the first p-type clad layer 5 is more than the Zn doping quantity in the first p-type clad layer 35.

The film thickness of the first p-type clad layer 5 is larger than the film thickness of the first p-type clad layer 35.

The Zn doping quantity in the etching stop layer 6 is more than the Zn doping quantity in the etching stop layer 36.

The Zn doping quantity in the second p-type clad layer 7 is larger smaller than the Zn doping quantity in the second p-type clad layer 37.

The Zn doping quantity in the cap layer 8 is larger than the Zn doping quantity in the cap layer 38.

Figure 7A:
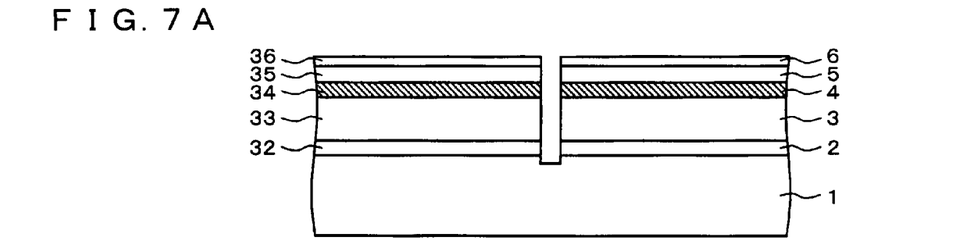
FIG. 7 is a sectional view illustrating a manufacturing process of the semiconductor laser device according to the preferred embodiment 2.

Next, a method of manufacturing the semiconductor laser device according to the preferred embodiment 2 is described. As shown in FIG. 7A, the n-GaAs buffer layers 2 and 32 are formed on the n-GaAs semiconductor substrate 1 by means of the MOCVD method or the like. The n-GaAs buffer layer 2 and the n-GaAs buffer layer 32 are formed with the different doping quantities. Next, the n-type clad layers 3 and 33 are formed on the buffer layers 2 and 32. Next, the active layers 4 and 34 that respectively emit the laser light are formed on the n-type clad layers 3 and 33. Further, the first p-type clad layers 5 and 35 are formed on the active layers 4 and 34. The first p-type clad layer 5 and the first p-type clad layer 35 are formed with the different doping quantities. Further, the etching stop layers 6 and 36 are formed on the first p-type clad layers 5 and 35. The first p-type clad layer 5 and the first p-type clad layer 35 are formed with the different doping quantities.

Figure 7B:
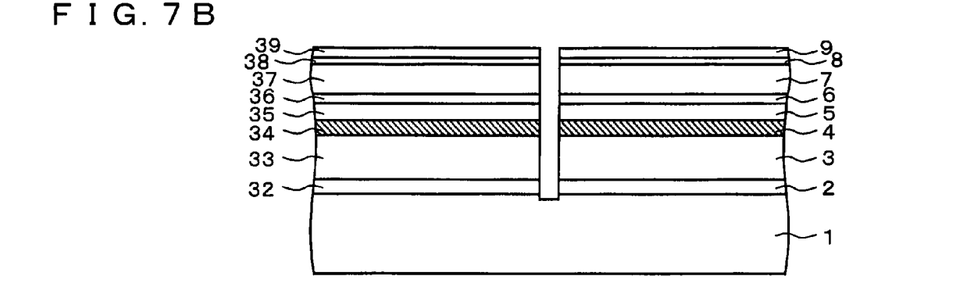

Next, as shown in FIG. 7b, the second p-type clad layers 7 and 37 are formed on the etching stop layers 6 and 36, and the cap layers 8 and 38 are formed on the second p-type clad layers 7 and 37. Further, the contact layers 9 and 39 are formed on the cap layers 8 and 38.

After the aforementioned respective layers are laminated, a ZnO stripe film is selectively formed on the surface of the grown layers corresponding to the light emitting end facet and its vicinity, while a SiN film is formed on any other part on the surface. The ZnO stripe film is formed in a band shape so as to cover the light emitting end facet along a longitudinal direction thereof. Then, a thermal annealing process is performed at 600° C. in the $N_2$ atmosphere for 90 minutes to diffuse Zn into the crystals from ZnO which is a diffusion source, so that the band gas of the active layers 4 and 34 are simultaneously increased. Thereby, the end facet window region 11 in which the band gap is increased is formed on the active layer 4. The end facet window region 11 is formed in the band shape so as to cover the light emitting end facet along the longitudinal direction thereof in a manner similar to the section where the ZnO stripe film is formed. As a result of the formation of the end facet window region 11, the catastrophic optical damage (COD) in the end facet due to the high-output operation and surge voltage can be controlled.

Figure 7C:
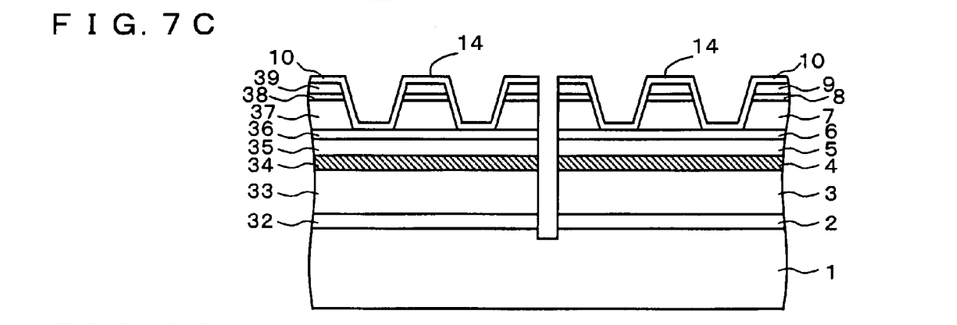

Next, as shown in FIG. 7C, the ZnO film and the SiN film are removed, and the contact layer 9, cap layer 8, and second p-type clad layer 7 are partially removed by means of the etching process. Here, these films to be etched are removed in a band shape along the surface of the grown layers and a direction orthogonally intersecting with the longitudinal direction of the end facet window region 11. As a result, the ridges 14 having a stripe shape are formed. The plurality of ridges 14 is formed in parallel with each other.

The embedding process is selectively performed on the surface of the ridges 14 so that the current blocking layer 10 is formed. The current blocking layer 10 consists of n-$Al_{0.5}In_{0.5}P$ in which Si is doped by the dopant density of $7.5\times10^{17}$ cm$^{-3}$.

Figure 7D:
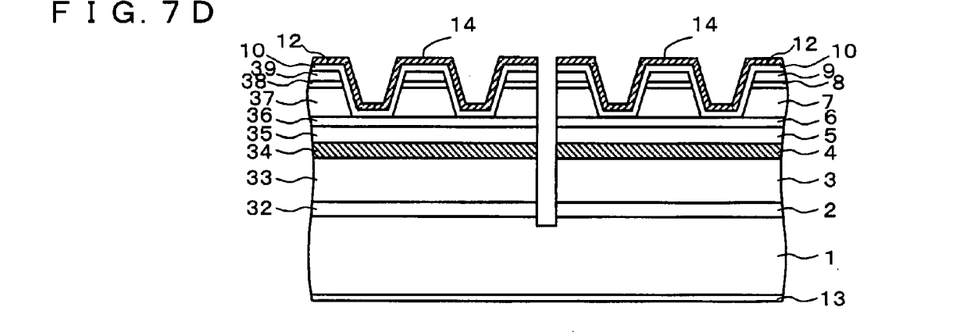

Finally, as shown in FIG. 7D, the p-side electrode 12 is formed on the surfaces of the contact layers 9 and 39 provided with the current blocking layer 10, and the n-side electrode 13 is formed on the rear surface of the n-GaAs semiconductor substrate 1 (surface on which the n-GaAs buffer layer 2 is not formed).

The aforementioned compositions in the respective layers is merely an example, and the composition ratios of In, Ga and Al included in the respective layers may be determined so that the following conditions can be satisfied:

The lattice constants of the respective layers 3, 33, 5, 35, 6, 36, 7 and 37 and the cap layers 8 and 38 formed according to the double hetero-junction structure are substantially equal to that of the n-GaAs semiconductor substrate 1;

In the red laser element a, the band gap energies of the n-type clad layer 3, first p-type clad layer 5, etching stop layer 6, second p-type clad layer 7 and cap layer 8 are larger than that of the active layer 4; and In the red laser element b, the band gap energies of the n-type clad layer 33, first p-type clad layer 35, etching stop layer 36, second p-type clad layer 37 and cap layer 38 are larger than that of the active layer 34.

All of the layers are formed through the crystal growth by means of the MOCVD method (Metal Organic Chemical Vapor Deposition), and impurities in the respective layers are added at the same time when the respective layers are crystal-grown.

Here, the effect based on the active layer structure and the strain compensated multiple quantum well structure in the red laser element a according to the preferred embodiment 2 is similar to that of the preferred embodiment 1, and is not described again. The difference between the preferred embodiments 1 and 2 is that the preferred embodiment is much more advantageous with respect to the catastrophic optical damage because the band gap energy of the active layer in the red laser element can be more increased than in the infrared laser element in a short time when the end facet window region 11 is formed on the light emitting end facet in the red laser element and the infrared laser element at the same time. As a result, the monolithic two-wavelength semiconductor laser element capable of achieving the higher output and higher reliability in comparison to the conventional multiple quantum well structure can be produced in a similar manner to that of the preferred embodiment 1 can be formed.

Though the preferred embodiments of this invention have been described in detail, it will be understood that various modifications may be made therein, and it is intended to cover in the appended claims all such modifications as fall within the true spirit and scope of this invention.

What is claimed is:

1. A semiconductor laser device comprising:
   a first clad layer formed on a semiconductor substrate;
   an active layer formed on the first clad layer and having a strained multiple quantum well structure;
   a second clad layer formed on the active layer; and
   a window region formed near end facets of the semiconductor laser device, the window region including a laser light path, the window region having a window region active layer of a wider band gap than a band gap of the active layer, wherein:
   the active layer and the window region active layer contain AlGaInP, and the active layer includes at least one blocking layer and at least one well layer,
   compression strain is applied to the well layer and tensile strain is applied to the blocking layer, and
   a sum of products of strain amounts and film thickness in the active layer is set to a negative value, and
   the second clad layer contains zinc in the window region, and
   the band gap of the active layer is increased by diffused zinc from the second clad layer in the window region.

2. The semiconductor laser device as claimed in claim 1, wherein
   a strain amount $\epsilon_{wi}$ of the well layer of an ith (i=1, . . . , n) order is defined as $\epsilon_{wi}=(a_{wi}-a)/a$, and a strain amount $\epsilon_{bj}$ of the barrier layer of a jth (j=1, . . . , m) order is defined as $\epsilon_{bj}=(a_{bj}-a)/a$ provided that a lattice constant of the semiconductor substrate is a, the lattice constant of the ith well layer is $a_{wi}$, and the film thickness thereof is $t_{wi}$, and the lattice constant of the jth barrier layer is $a_{bj}$ and the film thickness thereof is $t_{bj}$, and
   the sum of the products of the strain amounts and the film thickness, $\xi_{act}$, in the active layer is represented by $\xi_{act}=\Sigma(\epsilon_{wi} \times t_{wi})+\Sigma(\epsilon_{bj} \times t_{bj})$ provided that a total number of the well layers is n and a total number of the barrier layers is m.

3. The semiconductor laser device as claimed in claim 1, wherein the first clad layer is an n-type clad layer, and the second clad layer is a p-type clad layer.

4. The semiconductor laser device as claimed in claim 1, wherein
   the barrier layer comprises a combination of a blocking layer interposed between the adjacent well layers, and a light guide layer interposed between the well layer and the clad layer.

5. The semiconductor laser device as claimed in claim 1, wherein
   the strain amount $\epsilon_{wi}$, the film thickness $t_{wi}$, the strain amount $\epsilon_{bj}$, the film thickness $t_{bj}$, and the sum of the products of the strain amounts and the film thickness $\xi_{act}$ are set as follows:

$0\% < \epsilon_{wi} \leq 1.0\%$ $-1.4\% \leq \epsilon_{bj} < 0\%$ $3 \text{ nm} < t_{wi} < 8 \text{ nm}$ $3 \text{ nm} < t_{bj} < 8 \text{ nm}$ $-1.97 \times 10^{-10} < \xi_{act} < 0$.

6. A multi-wavelength semiconductor laser device comprising a plurality of semiconductor laser devices having different oscillation wavelengths respectively as claimed in claim 1, wherein
   these semiconductor laser devices are monolithically provided on the semiconductor substrate.

7. The semiconductor laser device as claimed in claim 1, wherein
   the semiconductor substrate consists of GaAs, the first clad layer consists of AlGaInP, and the second clad layer consists of AlGaInP.

8. The semiconductor laser device as claimed in claim 1, wherein
   the semiconductor substrate consists of GaAs, the first clad layer consists of AlGaInP, and the second clad layer consists of AlGaInP, the well layer consists of GaInP, and the barrier layer consists of AlGaInP.

9. The semiconductor laser device as claimed in claim 8, wherein
   the blocking layer and the light guide layer consist of AlGaInP, and
   a composition ratio of In to AlGa included in the blocking layer is larger than a composition ratio of In to AlGa included in the guide layer.

* * * * *